(12) United States Patent
De Geronimo

(10) Patent No.: US 8,890,085 B2
(45) Date of Patent: Nov. 18, 2014

(54) METHOD AND APPARATUS FOR ANALOG PULSE PILE-UP REJECTION

(71) Applicant: Brookhaven Science Associates, LLC, Upton, NY (US)

(72) Inventor: Gianluigi De Geronimo, Syosset, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 0 days.

(21) Appl. No.: 14/068,270

(22) Filed: Oct. 31, 2013

(65) Prior Publication Data

US 2014/0084961 A1 Mar. 27, 2014

Related U.S. Application Data

(63) Continuation of application No. 13/098,949, filed on May 2, 2011, now Pat. No. 8,618,495.

(60) Provisional application No. 61/330,437, filed on May 3, 2010.

(51) Int. Cl.
*H03K 5/1532* (2006.01)
*G01T 1/17* (2006.01)

(52) U.S. Cl.
CPC .............. *H03K 5/1532* (2013.01); *G01T 1/171* (2013.01)
USPC ........................................................ 250/395

(58) Field of Classification Search
CPC ... H03K 5/125; H03K 5/1532; G01R 19/0061
USPC ............................................ 327/78; 250/395
See application file for complete search history.

(56) References Cited

U.S. PATENT DOCUMENTS 4,658,216 A * 4/1987 Goulding et al. ............. 327/131
5,210,423 A * 5/1993 Arseneau ...................... 250/369

* cited by examiner

*Primary Examiner* — Constantine Hannaher
(74) *Attorney, Agent, or Firm* — Dorene M. Price

(57) ABSTRACT

A method and apparatus for pulse pile-up rejection are disclosed. The apparatus comprises a delay value application constituent configured to receive a threshold-crossing time value, and provide an adjustable value according to a delay value and the threshold-crossing time value; and a comparison constituent configured to receive a peak-occurrence time value and the adjustable value, compare the peak-occurrence time value with the adjustable value, indicate pulse acceptance if the peak-occurrence time value is less than or equal to the adjustable value, and indicate pulse rejection if the peak-occurrence time value is greater than the adjustable value.

4 Claims, 9 Drawing Sheets

METHOD AND APPARATUS FOR ANALOG PULSE PILE-UP REJECTION

CROSS REFERENCE TO RELATED APPLICATIONS

This application is a continuation of U.S. patent application Ser. No. 13/098,949, filed on May 2, 2011, the disclosure of which is incorporated by reference herein in its entirety.

STATEMENT OF GOVERNMENT RIGHTS

This invention was made with Government support under contract number DE-AC02-98CH10886, awarded by the U.S. Department of Energy. The Government has certain rights in the invention.

BACKGROUND

I. Field of the Invention

This invention relates generally to the field of sensors. In particular, the present invention applies to electronic systems that measure amplitudes of randomly arriving pulses, such as systems for in charge amplification and processing of signals from sensors.

II. Background of the Related Art

Detection is an established technique in the fields of nuclear medicine and astrophysics. In recent years, the use of detectors to image and characterize known as well as unknown sources has been advantageously applied to other fields such as biomedical research and the investigation of suspicious target materials at airports. By accurately sensing emitted signals from a target material, detection can be used to obtain information from concealed targets such as malignant tumors in human body, explosives, drug-based contraband, and nuclear-based contraband. Detection involves the processing of pulses, and inaccuracy may be introduced in the case where pile-up of these pulses, such as partial and/or complete superposition in time of these pulses, occurs.

In these systems pile-up, such as partial and/or complete superposition in time of considered pulses, may depend on signal rate and pulse width. Such pile-up generates distortion in the spectrum of a measured source due to pulse amplitudes arising from pile-up.

Pulse pile-up arises, for example, in conjunction with an increase in the event rate corresponding to events from a source. The time-of-arrival probability for corresponding pulses typically follows a Poisson distribution, with the interval between two events perhaps being expressed by the distribution function $I_1(t)$:

$$I_1(t) = r \times \exp(-r \times t),$$

where t is time and r is the average event rate. It is noted that the distribution indicates that the most probable interval between two events is zero. It is further noted that the distribution function indicates that as rate increases the probability of a short interval between events increases and pile-up occurs, with pile-up causing one or more peak detectors to measure one or more amplitudes higher than desired, such measurement generating spectral measurement distortion. The spectral measurement distortion limits the detection of spectral lines with amplitudes higher than the lines at a high rate.

Attempts to address pile-up of detected pulses have been made with limited success. Current approaches include those making use of digital signal processing. Such approaches are described, for example, in: W. Guo, S. H. Lee, and R. P. Gardner, "The Monte Carlo approach MCPUT for correcting pile-up distorted pulse-height spectra," Nucl. Instrum. Meth., A531, pp. 520-529, 2004; V. T. Jordanov and G. F. Knoll, "Digital pulse-shape analyzer based on fast sampling of an integrated charge pulse," IEEE Trans. Nucl. Sci., vol. 42, no. 4, pp. 683-687, 1995; M. W. Raad and L. Cheded, "Novel peak detection algorithms for pileup minimization in gamma ray spectroscopy," IEEE Proc. Instrum. Meas. Tech. Conf., pp. 2240-2243, 2006; G. F. Grinyer, C. E. Svensson, C. Andreoiu, A. N. Andreyev, R. A. E. Austin, G. C. Ball, et al., "Pile-up corrections for high-precision superallowed β decay half-life measurements via γ-ray photopeak counting," Nucl. Instrum. Meth., A579, pp. 1005-1033, 2007; F. Belli, B. Esposito, D. Marocco, M. Riva, and A. Zimbal, "Application of a digital pileup resolving method to high count rate neutron measurements," Rev. Sci. Instrum., vol. 79, 2008; M. Bolic, V. Drndarevic, and W. Gueaieb, "Pileup correction algorithms for very-high-count-rate gamma-ray spectrometry with NaI (Tl) detectors," IEEE Trans. Instrum. Meas., vol. 59, no. 1, pp. 122-130, 2010; U.S. Patent Application Publication No. 2009/0032715 of Mott; and U.S. Patent Application Publication No. 2009/0074281 of McFarland, et al., each of which is incorporated by reference in its entirety as if fully set forth in this specification.

Current approaches also include those making use of analog techniques. Such approaches are as described, for example, in: S. L. Blatt, J. Mahieux, and D. Kohler, "Elimination of pulse pile-up distortion in nuclear radiation spectra," Nucl. Instrum. Meth., 60, pp. 221-230, 1968; S. Popov, A. Vastly, V. Garbusin, and E. Morozof, "CAMAC standard high speed precise spectrometer," IEEE Nucl. Sci. Symp. Conf. Rec., pp. 375-378, 1995; T. Frizzi, L. Bombelli, C. Fiorini, and A. Longoni, "The SIDDHARTA chip: a CMOS multi-channel circuit for silicon drift detectors readout in exotic atoms research," 2006 IEEE Nucl. Sci. Symp. Conf. Rec., pp. 850-856, 2007; B. Sabbah and I. Klein, "Pile-up rejection by comparison of the shaped pulse with its second derivative," Nucl. Instrum. Meth., 95, pp. 221-230, 1968; G. Germano and E. J. Hoffman, "An investigation of methods of pileup rejection for 2-D array detectors employed in high resolution PET," IEEE Trans. Medical Imaging, vol. 10, no. 2, pp. 223-227, 1991; A. Dragone, G. De Geronimo, J. Fried, A. Kandasamy, P. O'Connor, and E. Vernon, "The PDD ASIC: highly efficient energy and timing extraction for high-rate applications," IEEE Nucl. Sci. Symp. Conf. Rec., pp. 914-918, 2005; and U.S. Pat. No. 6,573,762 to Wessensorf, et al., each of which is incorporated by reference in its entirety as if fully set forth in this specification.

Techniques making use of digital signal processing require fast Analog-To-Digital conversion (ADC) of the considered analog signal. Such techniques are described, for example, in W. Guo, S. H. Lee, and R. P. Gardner, "The Monte Carlo approach MCPUT for correcting pile-up distorted pulse-height spectra," Nucl. Instrum. Meth., A531, pp. 520-529, 2004; V. T. Jordanov and G. F. Knoll, "Digital pulse-shape analyzer based on fast sampling of an integrated charge pulse," IEEE Trans. Nucl. Sci., vol. 42, no. 4, pp. 683-687, 1995; and M. W. Raad and L. Cheded, "Novel peak detection algorithms for pileup minimization in gamma ray spectroscopy," IEEE Proc. Instrum. Meas. Tech. Conf., pp. 2240-2243, 2006, each of which is incorporated by reference in its entirety as if fully set forth in this specification. The power needed to perform ADC in each channel and the time needed for digital processing are prohibitive for at least those applications that require high density of channels or that have a limited power budget.

The most commonly adopted analog techniques to address pulse pile-up use an additional fast shaper and veto logic to detect and reject pile-up in the main slow shaper. Such techniques are described, for example, in S. L. Blatt, J. Mahieux, and D. Kohler, "Elimination of pulse pile-up distortion in nuclear radiation spectra," Nucl. Instrum. Meth., 60, pp. 221-230, 1968; S. Popov, A. Vastly, V. Garbusin, and E. Morozof, "CAMAC standard high speed precise spectrometer," IEEE Nucl. Sci. Symp. Conf. Rec., pp. 375-378, 1995; and T. Frizzi, L. Bombelli, C. Fiorini, and A. Longoni, "The SIDDHARTA chip: a CMOS multi-channel circuit for silicon drift detectors readout in exotic atoms research," 2006 IEEE NucL Sci. Symp. Conf. Rec., pp. 850-856, 2007, each of which is incorporated by reference in its entirety as if fully set forth in this specification. Such techniques require additional shaping and discrimination circuits.

Other analog techniques found in the literature are generally characterized with respect to the instant invention either by higher complexity or by the need for additional ADC and off-line processing. Such techniques are described, for example, in B. Sabbah and I. Klein, "Pile-up rejection by comparison of the shaped pulse with its second derivative," Nucl. Instrum. Meth., 95, pp. 221-230, 1968; G. Germano and E. J. Hoffman, "An investigation of methods of pileup rejection for 2-D array detectors employed in high resolution PET," IEEE Trans. Medical Imaging, vol. 10, no. 2, pp. 223-227, 1991; and A. Dragone, G. De Geronimo, J. Fried, A. Kandasamy, P. O'Connor, and E. Vernon, "The PDD ASIC: highly efficient energy and timing extraction for high-rate applications," IEEE NucL Sci. Symp. Conf. Rec., pp. 914-918, 2005, each of which is incorporated by reference in its entirety as if fully set forth in this specification.

In view of these foregoing and other considerations, there is a need to develop improved approaches for addressing distortion in detected signals due to pulse pile-up.

SUMMARY

Disclosed is an apparatus for pulse pile-up rejection including a delay value application constituent and a comparison constituent. The delay value application constituent is configured to receive a threshold-crossing time value. The delay value application constituent is further configured to provide an adjustable value according to a delay value and the threshold-crossing time value. The comparison constituent is configured to receive a peak-occurrence time value and the adjustable value. The comparison constituent is also configured to compare the peak-occurrence time value and the adjustable value. Additionally, the comparison constituent is configured to indicate pulse acceptance if the peak-occurrence time value is less than or equal to the adjustable value, and to indicate pulse rejection if the peak-occurrence time value is greater than the adjustable value.

Preferably, the delay value is calculated from a time jitter of the threshold-crossing time value, a time walk of the threshold-crossing time value, a time jitter of the peak-occurrence time value, a time walk of the peak-occurrence time value, and a combination thereof. Moreover, the delay value preferably is provided so that a difference between a peak occurrence time of a single pulse and the adjustable value ranges from 3% to 10% of a pulse peaking time of the single pulse. Also preferable is that the threshold-crossing time value is received from a discriminator constituent. Additionally preferable is that the peak-occurrence time value is received from a peak detection constituent.

The apparatus optionally further includes a constituent configured to provide the delay value. Moreover, the apparatus optionally further includes a constituent configured to analyze pile-up handling efficiency. The constituents of the apparatus are preferably employed in conjunction with measurement of pulse amplitude. Also preferable is that the constituents of the apparatus be implemented in Application-Specific Integrated Circuits (ASICs). The apparatus optionally also includes a constituent configured to perform pulse rejection if pulse rejection is indicated.

Additionally disclosed is a circuit for pulse pile-up rejection including a sensor, a charge amplifier, a filter, a discriminator, a time-to-amplitude converter, comparison logic, and a peak detector.

The sensor is configured to output a signal. The charge amplifier is configured to receive the signal. The charge amplifier is further configured to amplify the signal. The charge amplifier is also configured to output the amplified signal. The filter is configured to receive the amplified signal. The filter is further configured to filter the amplified signal. The filter is also configured to output the filtered signal.

The discriminator is configured to receive a threshold. The discriminator is further configured to receive the filtered signal. The discriminator is also configured to output a threshold-crossing time value if the filtered signal exceeds the threshold.

The time-to-amplitude converter is configured to receive the threshold-crossing time value. The time-to-amplitude converter is further configured to receive a trim value. The time-to-amplitude converter is also configured to output an adjustable value which is provided according to a delay value and the threshold-crossing time value, and the delay value is provided according to the trim value.

The comparison logic is configured to receive a peak-occurrence time value of the filtered signal. The comparison logic is further configured to receive the adjustable value. The comparison logic is also configured to compare the peak-occurrence time value and the adjustable value. The comparison logic is still further configured to output a reset signal if the peak-occurrence time value is greater than the adjustable value.

The peak detector is configured to receive the filtered signal. The peak detector is further configured to measure a pulse amplitude of the filtered signal. The peak detector is also configured to determine the peak-occurrence time value of the filtered signal. The peak detector is still further configured to output the peak-occurrence time value of the filtered signal.

The peak detector is also configured to output the pulse amplitude in the case where the reset signal is not received. The peak detector is additionally configured to perform pulse rejection in the case where the reset signal is received.

Additionally or optionally, the circuit includes a constituent configured to receive the pulse amplitude. The constituent is further configured to perform at least one of: producing an energy spectrum according to the pulse amplitude and displaying the energy spectrum, and counting the pulse amplitude and displaying an output according to the count.

Optionally, the sensor is one of the following: a radiation sensor, a chemical sensor, a mechanical sensor, a nuclear radiation sensor, a thermal radiation sensor, a medical imaging sensor, a sensor for scientific research, and a counterterrorism sensor. The constituent is optionally a computer, preferably with a display. The constituent is optionally implemented in application-specific integrated circuits. Optionally, the constituent is configured to also output the energy spectrum. The circuit optionally also includes a printer configured to receive and print the energy spectrum.

The filter is preferably configured to also optimize a signal-to-noise ratio of the amplified signal. Additionally preferable is that the filter defines a pulse width of the amplified signal. The circuit optionally further includes a trimmer configured to output the trim value received by the time-to-amplitude converter.

Also disclosed is a method for pulse pile-up rejection. The method includes providing an adjustable value according to a delay value and a threshold-crossing time value. The method also includes receiving a peak-occurrence time value. Additionally included in the method is comparing the peak-occurrence time value and the adjustable value. The method further includes indicating pulse acceptance if the peak-occurrence time value is less than or equal to the adjustable value, and indicating pulse rejection if the peak-occurrence time value is greater than the adjustable value.

Preferably, the delay value is calculated from a time jitter of the threshold-crossing time value, a time walk of the threshold-crossing time value, a time jitter of the peak-occurrence time value, a time walk of the peak-occurrence time value, and a combination thereof. Moreover, the delay value preferably is provided so that a difference between a peak occurrence time of a single pulse and the adjustable value ranges from 3% to 10% of a pulse peaking time of the single pulse. Further preferable is that the threshold-crossing time value is received from a discriminator constituent. Additionally preferable is that the peak-occurrence time value is received from a peak detection constituent.

The method preferably further includes providing the delay value. Moreover, the method optionally further includes analyzing pile-up handling efficiency. The method is preferably performed in conjunction with measurement of pulse amplitude. Further preferable is that the method is implemented in application-specific integrated circuits (ASICs). The method optionally also includes performing pulse rejection if pulse rejection is indicated. Additionally or optionally, the method includes receiving the threshold-crossing time value.

Additionally, a computer program product for pulse pile-up rejection comprising computer-executable program code stored on a non-transitory computer-readable storage medium is disclosed in which the computer-executable program code includes code for causing receipt of a threshold-crossing time value. The computer-executable program code further includes code for causing performance of providing an adjustable value according to a delay value and the threshold-crossing time value. The computer-executable program code also includes code for causing receipt of a peak-occurrence time value. The computer-executable program code additionally includes code for causing comparison of the peak occurrence time value and the adjustable value. The computer-executable program code further includes code for causing indication of pulse acceptance if the peak-occurrence time value is less than or equal to the adjustable value, and for causing indication of pulse rejection if the peak-occurrence time value is greater than the adjustable value.

Preferably, the delay value is calculated from a time jitter of the threshold-crossing time value, a time walk of the threshold-crossing time value, a time jitter of the peak occurrence time value, a time walk of the peak occurrence time value, and a combination thereof. Moreover, the delay value preferably is provided so that a difference between a peak occurrence time of a single pulse and the adjustable value ranges from 3% to 10% of a pulse peaking time of the single pulse. Also preferable is that the threshold-crossing time value is received from a discriminator constituent. Additionally preferable is that the peak occurrence time value is received from a peak detection constituent.

The computer-executable program code optionally further includes code for causing performance of providing the delay value. Moreover, the computer-executable program code optionally further includes code for causing analysis of pile-up handling efficiency. The computer program product is preferably employed in conjunction with measurement of pulse amplitude. The computer program product optionally also includes code for causing performance of pulse rejection in the case if pulse rejection is indicated.

The above and other embodiments of the present invention will become more apparent from the following description and illustrative embodiments which are described in detail with reference to the accompanying drawings.

DETAILED DESCRIPTION

Figure 1:
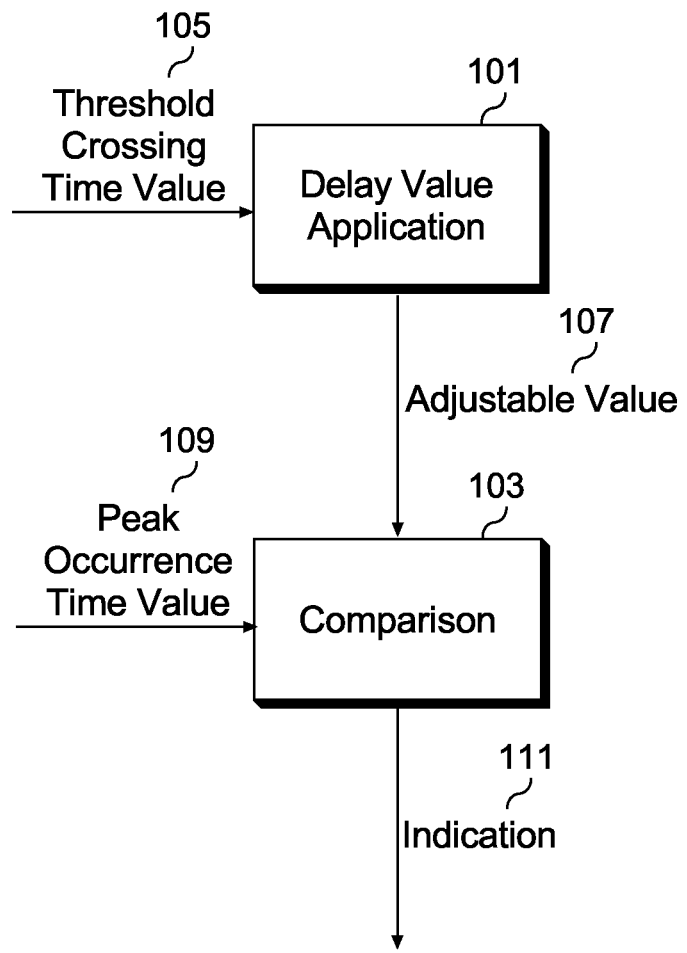
FIG. 1 is a block diagram of constituents performing pile-up handling operations according to an embodiment as described in the specification.

The present pile-up handling detects and rejects those amplitudes characterized by pile-up in order to recover sensitivity at higher amplitude. Moreover, the pile-up handling of the present invention provides efficient pile-up rejection, minimized dead time, power savings, time savings, and increased sensitivity to low amplitude signals compared to conventional pile-up handlers.

Pile-Up Handling Operations

Pile-up handling operations that address distortion due to pile-up in detected signals are disclosed. The pile-up handling operations include receiving a threshold-crossing time value and a peak occurrence time value for each peak detected in a receive signal. The pile-up handling operations further include comparing the peak occurrence time value with an adjustable value. As one example, the pile-up handling operations include determining if the peak occurrence time value is greater than the adjustable value. Alternately or additionally, the pile-up handling operations include determining if the peak occurrence time value is less than or equal to the adjustable value.

The adjustable value corresponds to the application of a delay value to the threshold-crossing time value. As one example, the delay value application serves to increase the threshold-crossing time value. Alternatively the delay value application serves to decrease the threshold-crossing time value. As a third alternative, the delay value application serves to leave the threshold-crossing time value unaltered. The threshold-crossing time value and the adjustable value correspond to a time window that starts at the threshold-crossing time value and stops at the adjustable value. Trigger functionality is preferably employed in the definition of the time window.

The delay value can be directly selected. Alternately or additionally, the delay value can be selected via election of a trim value. Election of a particular trim value, as one example, results in the delay value being set to the trim value. Alternatively, election of a particular trim value results in the delay value being set to a value proportional to the trim value. Trimmer functionality is preferably employed in trim value provision. The delay value may also be provided using other applicable methods. For example, a delay value may be provided by a time-to-amplitude converter followed by an adjustable threshold discriminator.

Pulse acceptance and/or pulse rejection is indicated in view of the outcome of the comparison of the peak occurrence time value with the adjustable value. For example, where the comparison finds the peak-occurrence time value to be greater than the adjustable value, pulse rejection is indicated. Alternately or additionally, where the comparison finds the peak-occurrence time value less than or equal to the adjustable value, pulse acceptance is indicated.

Such pulse indication may be implemented in a number of ways. As one example, indication that reset and rearming, such as reset and rearming of one or more channels, should occur is provided. As another example, indication of pulse acceptance involves the alteration of one or more toggles, such as channel-event toggles, and readout process commencement. Toggle alteration, for instance, involves setting of one or more toggles. Alternately or additionally, such toggle alteration involves clearing of one or more toggles. Such toggles are preferably implemented as one or more semaphores and/or flags.

The pile-up handling may be performed in an analog fashion, in a digital fashion, integrated and/or interfaced with analog functionality, and/or integrated and/or interfaced with digital functionality. The pile-up handling is performed by one or more constituents. The constituents may be implemented via hardware. Alternately or additionally, the constituents may be implemented via software. The pile-up handling is applicable to both simulations and working implementations.

Examples of implementation via hardware may include, but are not limited to, the employment of one or more of the following: circuits, gates, blocks, cells, e.g., standard and/or non-standard cells, gate arrays, Programmable Logic Devices (PLDs), Application-Specific Integrated Circuits (ASICs), Field-Programmable Gate Arrays (FPGAs), Programmable Array Logic devices (PALs), Gate Array Logic devices (GALs).

Implementation via software preferably involves the employment of one or more software modules. Such software modules may be programmed, for example, using languages such as Java, Objective C, C, C#, C++, Perl, Python, and/or Comega. The modules preferably communicate via Simple Object Access Protocol (SOAP), Java Messaging Service (JMS), Remote Method Invocation (RMI), Remote Procedure Call (RPC), sockets, and/or pipes.

FIG. 1 is a block diagram of constituents performing the pile-up handling operations. The delay value application is performed by a delay value application constituent (101). Delay value application constituent (101) receives a threshold-crossing time value (105) and output an adjustable value (107). Threshold-crossing time value (105) is preferably received from a discriminator constituent. The discriminator constituent may be implemented via hardware and/or software, and associated with sensor and/or detector hardware and/or software. Implementation of delay value application constituent (101) preferably involves the employment of Time-to-Amplitude Converter (TAC) hardware and/or software. Delay value application constituent (101) receives a trim value from a trimmer. Implementation of such trimmer involves the employment of trimmer hardware and/or software. Preferably, a 3-bit trimmer is employed. Implementation of trigger functionality involves the employment of trigger hardware and/or software. Preferably Schmitt trigger hardware and/or software are employed.

Comparison in accordance with embodiments of the present invention is performed by a comparison constituent (103). Comparison constituent (103) receives adjustable value (107) and a peak-occurrence time value (109), and dispatch a pulse indication. Peak-occurrence time value (109) is preferably received from, and pulse indication (111) is preferably output to, a peak detection constituent. The peak detection constituent may be implemented via hardware and/or software, and are preferably associated with sensor and/or detector hardware and/or software.

Figure 2:
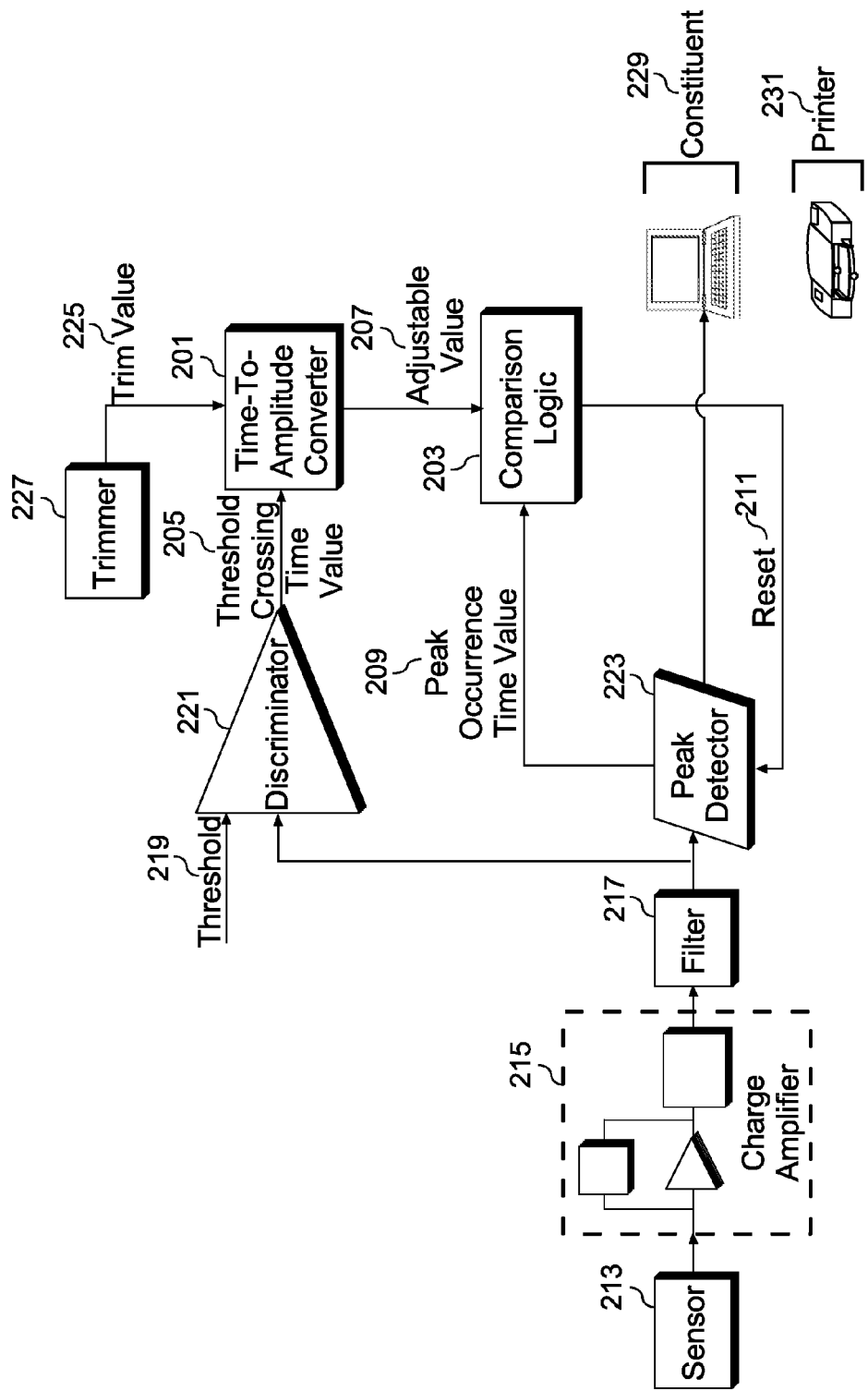
FIG. 2 is an example of circuitry for implementing an embodiment as described in the specification.

FIG. 2 is an example of circuitry for implementing one embodiment of the present invention. Charge amplifier (215) provides low-noise amplification of signals from a sensor (213) and passes the result to a filter (217). Sensor (213) may, for instance, be a sensor that outputs analog changes that may be converted into electrical signals. As one example, sensor (213) is a radiation sensor, such as a nuclear radiation sensor or a thermal radiation sensor. Alternatively, sensor (213) is a chemical sensor. As a third alternative, sensor (213) is a mechanical sensor. Specific examples of sensor (213) include: a medical imaging sensor, a sensor for scientific research, and a counterterrorism sensor.

Filter (217) provides optimization of signal-to-noise ratio and defines pulse width, and passes the result to a discriminator (221) and to a peak detector (223). Discriminator (221) selects, for processing by peak detector (223), signals exceeding a threshold (219). Such peak detector processing generally includes measurement of pulse amplitude. Sensor (213), charge amplifier (215), filter (217), discriminator (221), and peak detector (223) represent a detector electronic chain.

A Time-to-Amplitude Converter (TAC) (201) receives a threshold-crossing time value (205) from discriminator (221) and a trim value (225) from a trimmer (227). TAC (201) performs delay value application in accordance with the present invention and dispatches an adjustable value (207). Comparison logic (203) receives adjustable value (207) from TAC (201) and peak-occurrence time value (209) from peak detector (223). Comparison logic (203) performs comparison in accordance with the present invention, and dispatches in accordance with the present invention a reset signal (211) to peak detector (223). Peak detector (223) responds to reset signal (211) by performing pulse rejection. Constituent (229) receives, in the case where reset is not dispatched, pulse amplitude data from peak detector (223).

Constituent (229) counts pulses and produces energy spectra. Constituent (229) displays the produced spectra on a display. Alternately or additionally, constituent (229) counts pulses and displays an output expressing the count such as one or more values indicating the number of pulses counted. Optionally, constituent (229) counts pulses within specified energy windows. Constituent (229) can optionally provide produced spectra or pulse counts to equipment such as printer (231) and laboratory equipment. Printer (231) optionally prints the produced spectra or pulse counts. Examples of implementation of constituent (229) include the employment of a computer and the employment of application-specific integrated circuits.

The pile-up handling is preferably performed with respect to the detector electronic chain of FIG. 2. The pile-up handling preferably makes use of constituents already employed in the detector electronic chain of FIG. 2, with the additions of a delay value application constituent, a comparison constituent, and a trimmer as discussed above.

Delay Value Selection Operations

The present delay value selection operations are performed to customize the pile-up handling operations. As noted above, the pile-up handling operations include determining if the peak-occurrence time value is greater than the adjustable value and/or determining if the peak-occurrence time value is less than or equal to the adjustable value. Accordingly the delay value is selected so that the peak-occurrence time value of each individual pulse is less than or equal to the adjustable value, and/or so that the peak-occurrence time value of pile-up pulses is greater than the adjustable value.

Figure 3:
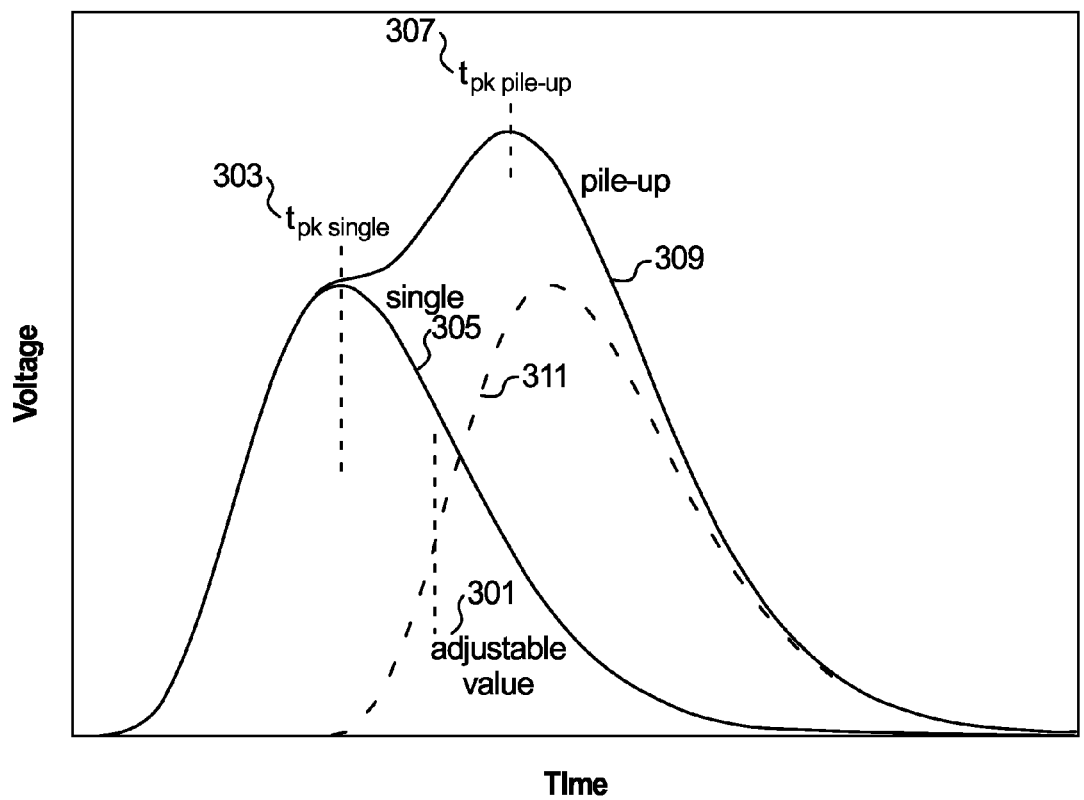
FIG. 3 illustrates an example of a single pulse, pile-up pulses, and an adjustable value as described in the specification.

FIG. 3 illustrates exemplary single and pile-up pulses. Depicted relative to a peak-occurrence time value (303) of a single pulse (305) and further relative to a peak-occurrence time value (307) of pile-up pulses (309) is an adjustable value (301), in which the peak-occurrence time value (303) is less than the adjustable value (301), and the peak-occurrence time value (307) is greater than the adjustable value (301). Also illustrated in FIG. 3 is a second single pulse (311). The adjustable value (301) is further depicted relative to the second single pulse (311).

Moreover, the delay value may be preferably selected such that the time jitter associated with the threshold-crossing time value, the time walk associated with the threshold-crossing time value, the time jitter associated with the peak-occurrence time value, and the time walk associated with the peak-occurrence time value are taken into account. The delay value may be calculated from the time jitter or time walk associated with the threshold-crossing time value, or the time jitter or time walk associated with the peak-occurrence time value, or a combination thereof.

Figure 4:
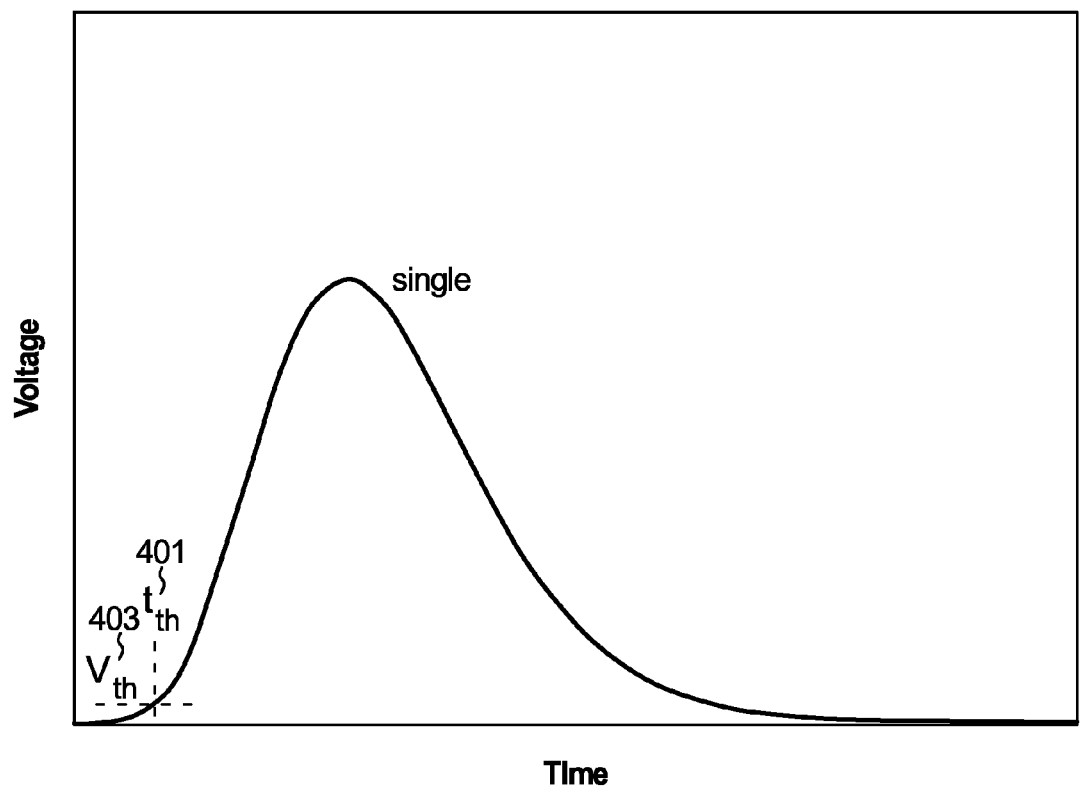
FIG. 4 illustrates a threshold-crossing time value and a threshold voltage relative to an exemplary single pulse according to an embodiment as described in the specification.

The time jitter of the threshold-crossing time value is calculated as:

$$\sigma t_{th} \approx \frac{\sigma_V}{\left.\frac{dV}{dt}\right|_{V=V_{th}}},$$

where $\sigma t_{th}$ is the time jitter of the threshold-crossing time value, $\sigma_V$ is the Root Mean Square (RMS) noise of V which is a time varying voltage value characterizing the amplitude of the pulses, and $dV/dt$ is the slope of V calculated at the crossing of a threshold, $V_{th}$. FIG. 4 illustrates threshold-crossing time value (401) and threshold $V_{th}$ (403) relative to an exemplary single pulse.

The time jitter of the peak-occurrence time value is calculated as:

$$\sigma t_{pk} \approx \frac{\sigma_V \tau_p \lambda_p}{-\rho_p},$$

where $\sigma t_{pk}$ is the time jitter of the peak-occurrence time value, $\sigma_V$ is the same as defined above, $\tau_p$ is the shaper peaking time, or pulse peaking time, corresponding to one or more employed pulse shapers, e.g., 1% to peak, $\lambda_p$ is a value characterizing the type of the employed pulse shapers, and $\rho_p$ is a value characterizing the order of the employed pulse shapers. As an illustrative example, employment of a particular fifth-order shaper with complex-conjugate poles leads to a $\lambda_p$ value of 1.58 and a $\rho_p$ value of 3.65. For a third-order shaper with real coincident poles, the values of $\lambda_p$ and $\rho_p$ would be 1.64 and 1.85, respectively.

The time walk of the threshold-crossing time value is calculated by taking into account of type and order of pulse shapers or shapers employed. The time walk of the peak-occurrence time value may be calculated with the time walk being taken as of the first order and independent of peak amplitude.

Figure 5:
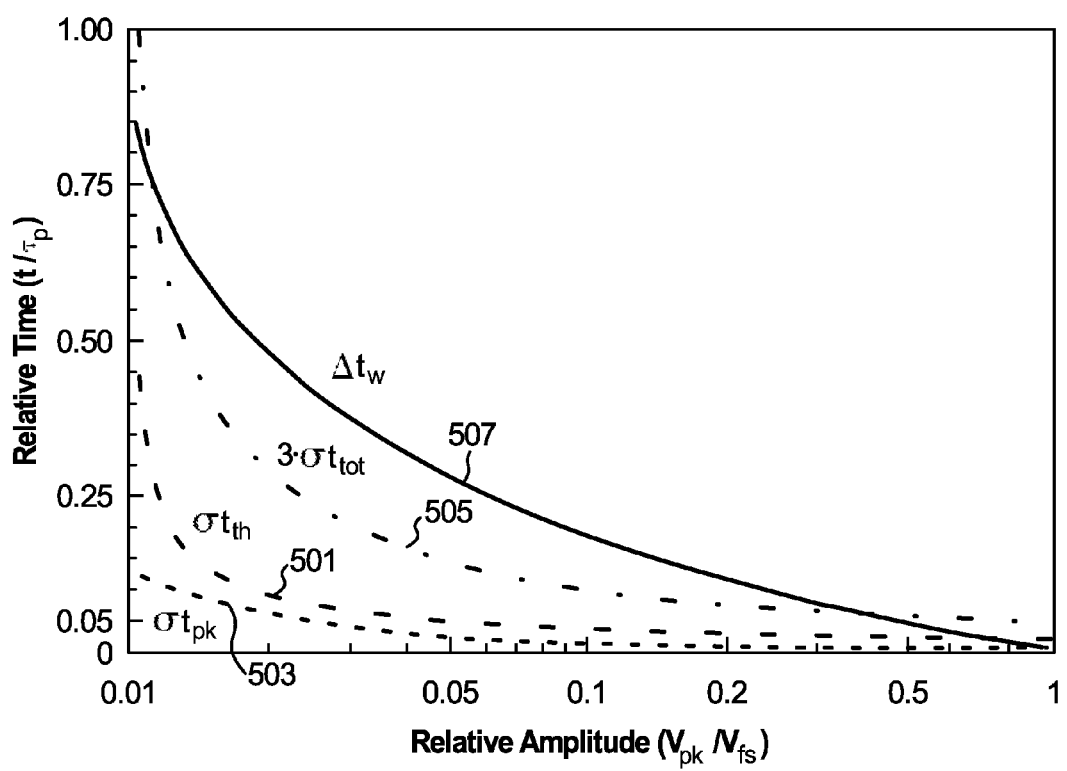
FIG. 5 is a graph illustrating an example of time jitters and time walk associated with the threshold-crossing time value and the peak occurrence time value of FIG. 2.

FIG. 5 is a graph illustrating an example of time jitters and time walk associated with threshold-crossing time value (205) and peak-occurrence time value (209) of FIG. 2. Shown in FIG. 5 is a curve for time jitter $\sigma t_{th}$ (501) of the threshold-crossing time value and a curve for time jitter $\sigma t_{pk}$ (503) of the peak-occurrence time value. The curves are normalized to $\tau_p$ and are plotted as functions of peak amplitude of V ($V_{pk}$) normalized to the full scale of V ($V_{fs}$). The curves of FIG. 5 take $V_{th}$ to be 1% of $V_{fs}$ and take $\sigma_V$ to be 0.3% of $V_{fs}$.

Further shown in FIG. 5 is 3·$\sigma t_{tot}$ (505), where $\sigma t_{tot}$ is the quadratic sum of $\sigma t_{th}$ and $\sigma t_{pk}$ when the worst case scenario of no correlation occurs. Employment of the coefficient 3 allows for consideration of in excess of 99% of instances of jitter in the case of a Gaussian jitter distribution. A different coefficient may also be employed according to the noises of the system. Additionally shown in FIG. 5 is time walk $\Delta t_w$ (507) associated with the threshold-crossing time value.

A value $\Delta t$ reflecting the delay value and corresponding to the difference between a peak occurrence time of a single pulse and the adjustable value is preferably considered, with selection of the delay value preferably being stated in terms of $\Delta t$.

FIG. 5 reflects the delay value that should preferably be selected. More specifically, in view of 3·$\sigma t_{tot}$ rising as the peak amplitude declines, FIG. 5 indicates that to ensure negligible rejection of valid pulses, the delay value should be selected so that $\Delta t$ exceeds 3·$\sigma t_{tot}$. Moreover, in view of time walk $\Delta t_w$ increasing as the peak amplitude declines, time walk $\Delta t_w$ is recognized as lowering pile-up rejection efficiency as peak amplitude declines. But, in view of time walk $\Delta t_w$ exceeding 3·$\sigma t_{tot}$, the time walk $\Delta t_w$ is recognized as preventing, over a wide range of amplitudes, loss of valid pulses due to time jitter when the delay value is selected such that $\Delta t$ has a low value. Thus, in accordance with FIG. 5, a delay value of $\Delta t$ equal to the highest 3·$\sigma t_{tot}$ in the range where the time walk $\Delta t_w$ is lower than 3·$\sigma t_{to}$ may be selected. If the delay value is selected higher, too many piled-up events may be accepted; but if the delay value is selected lower, too many single (valid) events may be rejected. In one example, the delay value may preferably be selected such that $\Delta t$ is in the range 0.03·$\tau_p$ to 0.10·$\tau_p$, and more particularly, the delay value may preferably be selected such that $\Delta t = 0.05·\tau_p$.

The pile up handling is, for example, applicable in contexts where pixels (e.g., Silicon Drift Detector (SDD) pixels) are employed. For application in such contexts, one approach is to take the dispersion in the diffusion of charge collected at a pixel, e.g., at the anode of the pixel, to be negligible as far as selection of the delay value is concerned. Another approach in such contexts is to take dispersion into account in selection of the delay value. As an illustrative example of taking dispersion into account, where dispersion increases with the distance of the pixel anode from the interaction point and a value of about 15 ns RMS is estimated, the impact on amplitude is found to be 0.2%, and the impact on peaking time is found to be 7.5 ns. In this example, to prevent loss of valid events, the delay value is selected such that Δt increases, with respect to a Δt value taking dispersion to be negligible, by 7.5 ns.

The delay value selection is preferably performed with respect to the circuitry of FIG. 2. The delay value selection may be performed manually. Optionally, the delay value selection may, alternately or additionally, be automated. Automated delay value selection can be performed in an analog fashion, in a digital fashion, integrated and/or interfaced with analog functionality, and/or integrated and/or interfaced with digital functionality. Automated delay value selection may be performed by one or more constituents. The constituents may be implemented via hardware. Alternately or additionally, the constituents may be implemented via software. The delay value selection is applicable to both simulations and working implementations.

Examples of implementation of the constituents via hardware include the employment of one or more of the following: circuits, gates, blocks, cells, e.g., standard and/or non-standard cells, gate arrays, PLDs, ASICs, FPGAs, PALs, GALs Implementation of the constituents via software preferably involves the employment of one or more software modules. Such software modules may be programmed, for example, using languages such as Java, Objective C, C, C#, C++, Perl, Python, and/or Comega. The modules preferably communicate via SOAP, JMS, RMI, RPC, sockets, and/or pipes.

Evaluation Operations

Evaluation operations are optionally performed. Such evaluation operations can, for example, be performed with respect to simulation corresponding to the pile-up handling of the present invention. In addition, such evaluation operations can be performed with respect to working implementation of the pile-up handling of the present invention.

Figure 6:
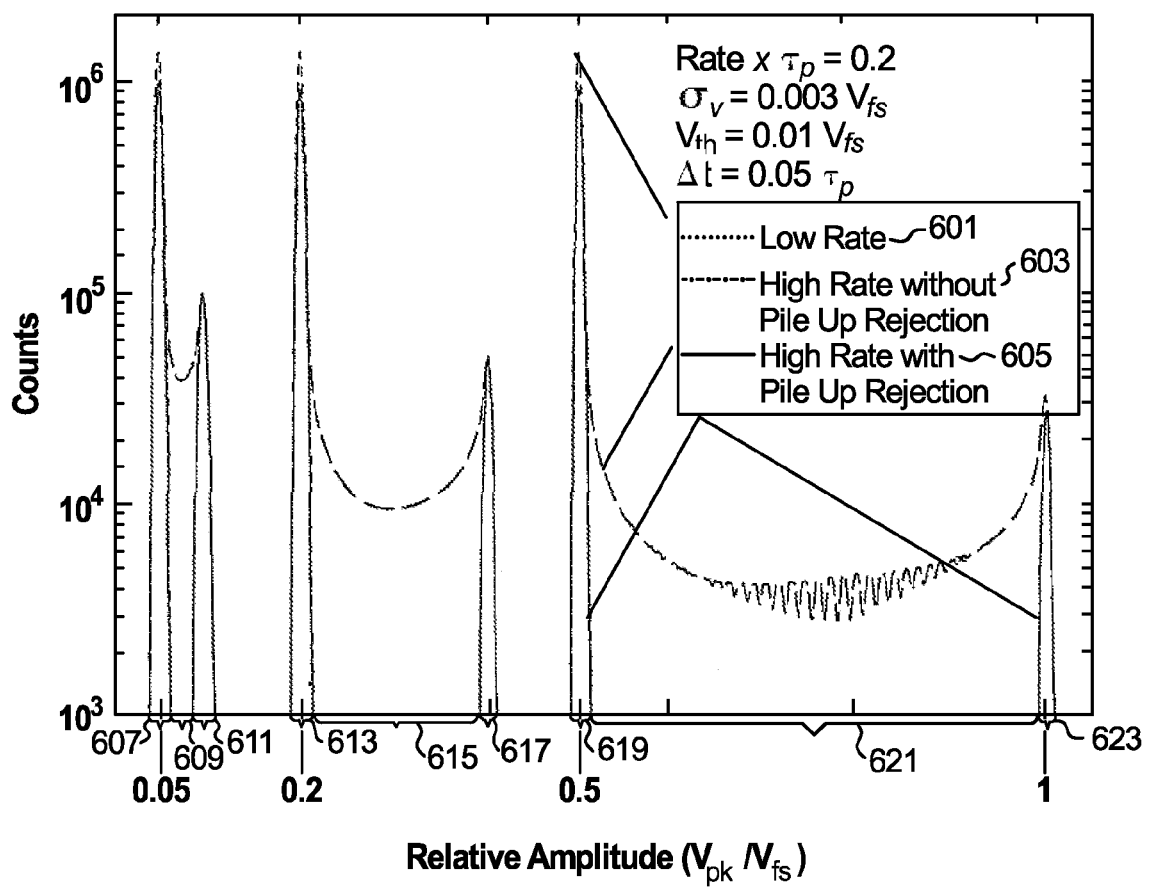
FIG. 6 graphically illustrates a spectrum corresponding to simulated output of the circuitry of FIG. 2.

FIG. 6 graphically illustrates a spectrum corresponding to simulated output of the circuitry of FIG. 2. The simulation employs single-energy spectral lines for the amplitudes 0.05, 0.2, and 0.5. The amplitudes, represented by $V_{pk}$ normalized to $V_{fs}$, are relative amplitudes. In the simulation, these spectral lines are employed at low rate (601), at a high rate without employment of the pile-up handling of the present invention (603), and at a high rate with employment of the pile-up handling of the present invention (605), where the high rate is $0.2/\tau_p$. Further in the simulation, $\tau_V$ is set to be $0.003 \cdot V_{fs}$, $V_{th}$ is set to be $0.01 \cdot V_{fs}$, and the delay value is set such that $\Delta t = 0.05 \cdot \tau_p$.

FIG. 6 Illustrates regarded-correctly-counted region (607), regarded-rejectable region (609), and regarded-unavoidable-pileup-induced-miscount region (611) corresponding to amplitude 0.05. Further illustrated in FIG. 6 are regarded-correctly-counted region (613), regarded-rejectable region (615), and regarded-unavoidable-pileup-induced-miscount region (617) corresponding to amplitude 0.2. Still further illustrated in FIG. 6 are regarded-correctly-counted region (619), regarded-rejectable region (621), and regarded-unavoidable-pileup-induced-miscount region (623) corresponding to amplitude 0.5. Each of the regarded-unavoidable-pileup-induced-miscount region relates to count recordation of amplitude double of the corresponding input amplitude. Moreover, each regarded-unavoidable-pileup-induced-miscount region corresponds to fully-superposed events, with it being recognized that, even in the ideal case, fully-superposed events (e.g., corresponding to the superposition of two individual, non-correlated events) cannot be discriminated.

Plotted lines within FIG. 6 indicate recorded counts. For example, for input amplitude 0.05, points are plotted in regarded-correctly-counted region (607) for each of low rate (601), high rate without employment of the pile-up handling of the present invention (603), and high rate with employment of the pile-up handling of the present invention (605). This indicates that for each of low rate (601), high rate without employment of the pile-up handling of the present invention (603), and high rate with employment of the pile-up handling of the present invention (605), a certain quantity of pulses are recorded as having amplitudes at or near the 0.05 amplitude actually input.

Also for input amplitude 0.05, points are plotted in regarded-unavoidable-pileup-induced-miscount region (611) for each of low rate (601), high rate without employment of the pile-up handling of the present invention (603), and high rate with employment of the pile-up handling of the present invention (605). This indicates that for each of low rate (601), high rate without employment of the pile-up handling of the present invention (603), and high rate with employment of the pile-up handling of the present invention (605), a certain quantity of pulses are recorded as having amplitudes at or near 0.10—at or near double the 0.05 amplitude which was actually input. As noted, these recordations correspond to fully-superimposed events.

Further for input amplitude 0.05, those points plotted in regarded-rejectable region (609) indicate pulses that are recorded as having amplitudes greater than those amplitudes associated with regarded-correctly-counted region (607) but less than those amplitudes associated with regarded-unavoidable-pileup-induced-miscount region (611).

Likewise holds analogously true with respect to regarded-correctly-counted region (613), regarded-unavoidable-pileup-induced-miscount region (617), and regarded-rejectable region (615) for input amplitude 0.2, and with respect to regarded-correctly-counted region (619), regarded-unavoidable-pileup-induced-miscount region (623), and regarded-rejectable region (621) for input amplitude 0.5.

Recorded counts in any of regarded-rejectable region (609), regarded-rejectable region (615), and regarded-rejectable region (621) are indicative of pulse pile-up rejection failure. FIG. 6 shows counts in these regions in the case of high rate without employment of the pile-up handling of the present invention (603). However, FIG. 6 shows no counts in these regions in the case of high rate with employment of the present pile-up handling (605). This shows the effectiveness of the pile-up handling of the invention. As can be seen, for low rate (601) pile-up does not appear to be much of a problem.

Figure 7:
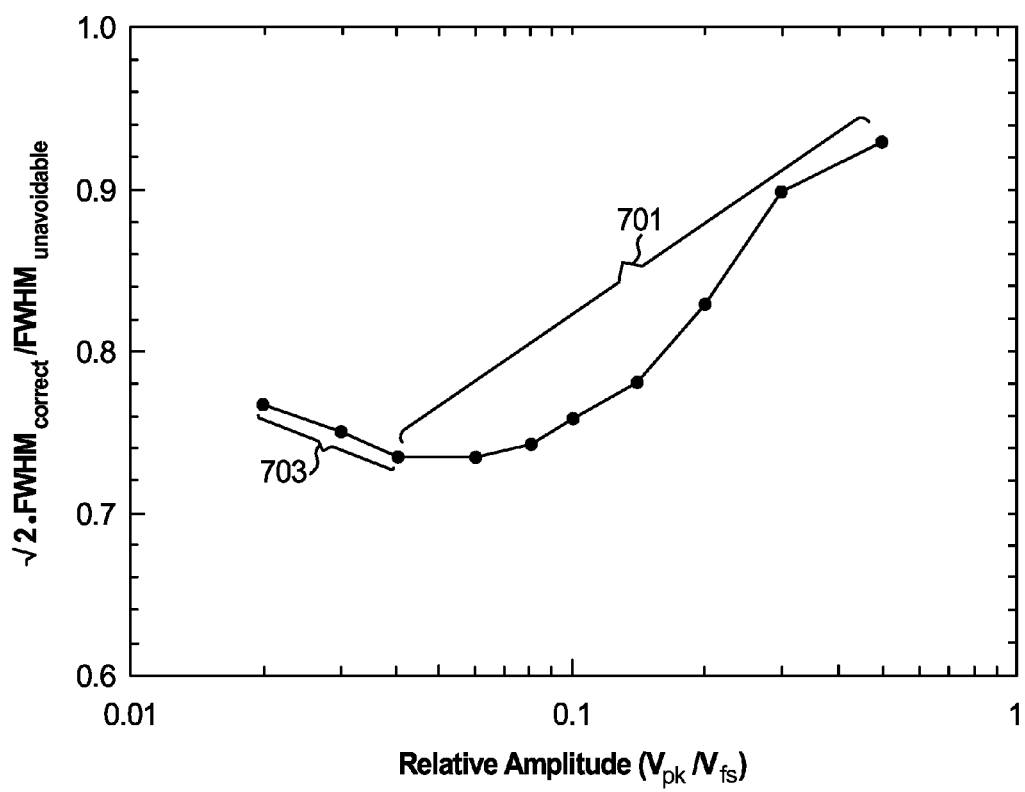
FIG. 7 is an efficiency plot corresponding to the simulated output of the circuitry of FIG. 2.

Analysis performed with respect to simulation preferably includes consideration of pile-up handling efficiency. As an illustrative example, such efficiency consideration will be discussed with respect to the simulation of the circuitry of FIG. 2. FIG. 7 is an efficiency plot corresponding to the simulated output of the circuitry of FIG. 2. Depicted in FIG. 7 is the efficiency ratio ε:

$$\varepsilon = \sqrt{2} \, \frac{FWHM_{correct}}{FWHM_{unavoidable}}$$

which, in the ideal case, approaches the value 1.

In this ratio, $FHWM_{correct}$ represents a full-width-at-half-maximum calculation corresponding to the counts plotted, with respect to employment of the pile-up handling of the present invention, within the regarded-correctly-counted regions of FIG. 6. Also in this ratio, $FHWM_{unavoidable}$ represents a full-width-at-half-maximum calculation corresponding to the counts plotted, with respect to employment of the pile-up handling of the present invention, within the regarded-unavoidable-pileup-induced-miscount regions of FIG. 6. Further in this ratio, $\sqrt{2}$ is a factor added in view of $FHWM_{unavoidable}$ being $\sqrt{2}$ times larger than $FHWM_{correct}$ and there being a desire that the ratio, in the ideal case, approaches the value 1. The ratio, in one aspect, compares $FHWM_{correct}$ and $FHWM_{unavoidable}$. Such comparison is equivalent to a comparison of $FHWM_{correct}$ and a full-width-at-half-maximum calculation corresponding to the counts plotted, with respect to the pile-up handling of the invention not being employed, within the regarded-correctly-counted regions of FIG. 6.

FIG. 7 illustrates that the efficiency is decreasing with decrease in peak relative amplitude as shown by segment (701), and it increases as shown by segment (703) due to a decline in the contribution of piled-up events to line broadening compared with actual noise. In contrast to the noise, the contribution of the pile-up to the line broadening drops as the peak relative amplitude falls. Further, FIG. 7 illustrates that the peak-to-valley ratio of the spectrum with pile-up decreases with amplitude. This phenomenon is explainable when considering that, for low amplitudes, the same number of pile-up events is spread over a smaller range of amplitudes.

Figure 8:
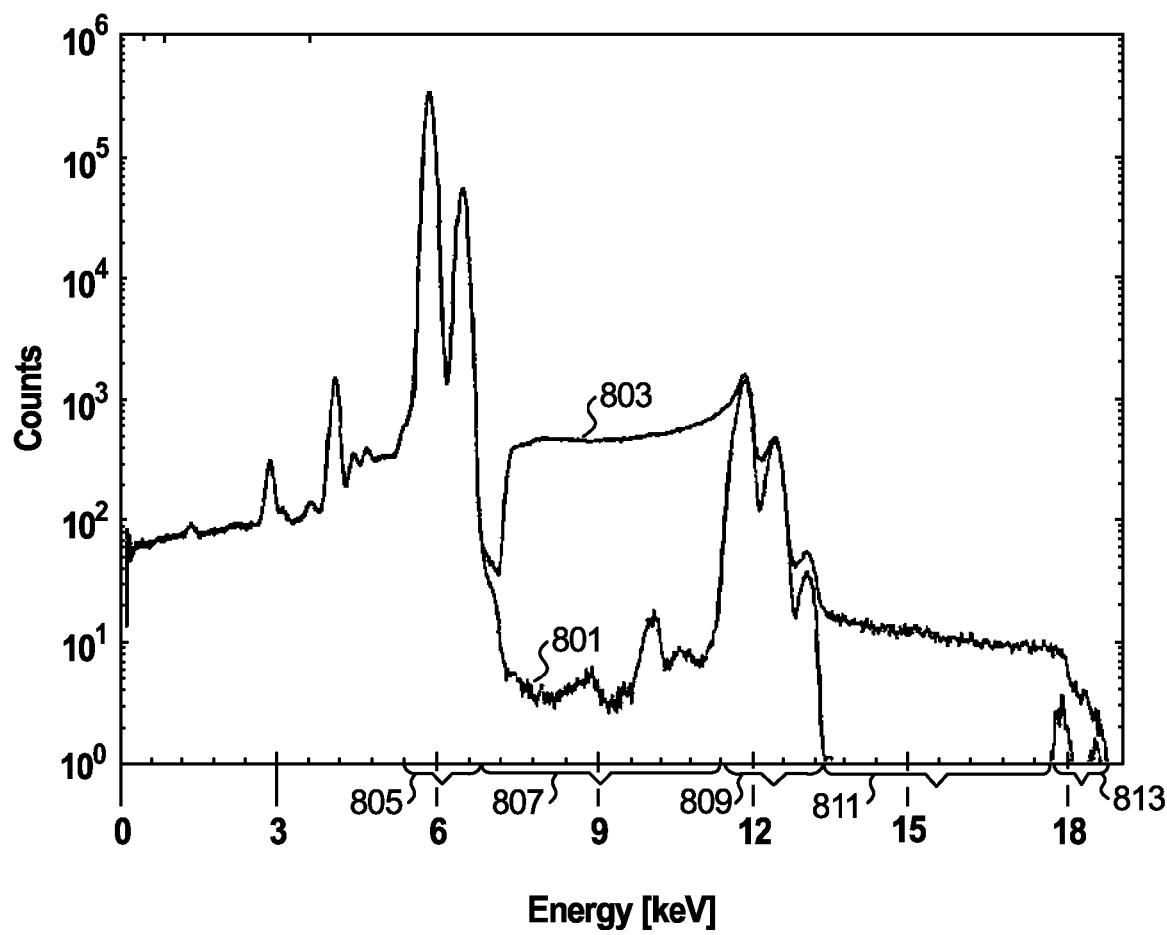
FIG. 8 graphically illustrates a spectrum corresponding to an exemplary working implementation of the circuitry of FIG. 2.

FIG. 8 is a spectrum corresponding to an exemplary working implementation of the circuitry of FIG. 2. Shown in FIG. 8 is experimental data output (801), produced by constituent (229) of FIG. 2, for operation with the pile-up handling according to the present invention. Also shown in FIG. 8 is output (803), produced by constituent (229) of FIG. 2, for operation without the pile-up handling of the present invention. In the exemplary operation of the circuitry of FIG. 2, a rate of 200 kilocounts/s (kcps), a $\tau_p$ value of 1 µs, and a gain of 2.6 V/fC are employed, where such gain extends the energy range to more than 18 keV.

Further shown in FIG. 8 are, corresponding to two $^{55}$Fe spectra, regarded-correctly-counted region (805), regarded-rejectable region (807), regarded-unavoidable-pileup-induced-miscount region (809), regarded-rejectable region (811), and regarded-unavoidable-pileup-induced-miscount region (813). The count recordation within the regarded-correctly-counted region and within the regarded-unavoidable-pileup-induced-miscount regions depict $Mn_{K\alpha}$ and $Mn_{K\beta}$ $^{55}$Fe emissions and correspond to $Mn_{K\alpha}$ lines, $Mn_{K\beta}$ lines, and combinations thereof. Regarded-unavoidable-pileup-induced-miscount region (809) relates to count recordation of amplitude double of the corresponding input amplitude. Regarded-unavoidable-pileup-induced-miscount region (813) relates to count recordation of amplitude triple of the corresponding input amplitude. Moreover, each of regarded-unavoidable-pileup-induced-miscount region (809) and regarded-unavoidable-pileup-induced-miscount region (813) corresponds to fully-superposed events, recognizing that even in the ideal case, fully-superposed events cannot be discriminated.

Plotted lines within FIG. 8 indicate recorded counts. Recorded counts in any of regarded-rejectable region (807) and regarded-rejectable region (811) are indicative of pulse pile-up rejection failure.

FIG. 8 shows counts (803) in region 807 in the case of operation without the pile-up handling of the present invention. FIG. 8 also shows counts (801) in this region in the case of operation with the pile-up handling according to the present invention. However, the quantity of counts shown in the case of operation with the pile-up handling is less than the quantity of counts shown in the case of operation without the pile-up handling. FIG. 8 shows counts (803) in region (811) in the case of operation without the pile-up handling of the present invention. FIG. 8 shows no counts (801) in region 811 in the case of operation with the pile-up handling according to the present invention. These differences in quantity of counts show the effectiveness of the pile-up handling of the present invention.

Analysis performed with respect to implementation of the present invention includes consideration of pile-up handing efficiency. As an illustrative example, such efficiency consideration is discussed with regard to the data illustrated in FIG. 8. Accordingly, with respect to FIG. 8 the efficiency ratio $\epsilon_{Fe}$:

$$\varepsilon_{Fe} = \sqrt{2}\ \frac{FWHM_{correct-Fe}}{FWHM_{unavoidable-Fe}}$$

is explored. Like the ratio discussed in connection with FIG. 6, this ratio, in the ideal case, approaches the value 1.

In this ratio, $FHWM_{correct-Fe}$ represents a full-width-at-half-maximum calculation corresponding to the counts plotted, in the case of operation with the pile-up handling according to the present invention, within the regarded-correctly-counted region of FIG. 8. Also in this ratio, $FHWM_{unavoidable-Fe}$ represents a full-width-at-half-maximum calculation corresponding to the counts plotted, in the case of operation with the pile-up handling according to the present invention, within regarded-unavoidable-pileup-induced-miscount region (809) of FIG. 8. Further in this ratio, $\sqrt{2}$ is a factor added in view of $FHWM_{unavoidable-Fe}$ being $\sqrt{2}$ times larger than $FHWM_{correct-Fe}$, and there being a desire that the ratio, in the ideal case, approaches the value 1. The ratio, in one aspect, compares $FHWM_{correct-Fe}$ with $FHWM_{unavoidable-Fe}$. Such comparison is equivalent to a comparison of $FHWM_{correct-Fe}$ and a full-width-at-half-maximum calculation corresponding to the counts plotted, in the case of operation without the pile-up handling of the present invention, within the regarded-correctly-counted region of FIG. 8.

The evaluation is preferably performed with respect to the circuitry of FIG. 2. The evaluation can be performed manually. Optionally, the evaluation can, alternately or additionally, be automated. Automated evaluation may be performed in an analog fashion, in a digital fashion, integrated and/or interfaced with analog functionality, and/or integrated and/or interfaced with digital functionality. Automated evaluation may be performed by one or more constituents. The constituents may be implemented via hardware. Alternately or additionally, the constituents may be implemented via software. The evaluation is applicable to both simulations and working implementations.

Examples of implementation via hardware include the employment of one or more of the following: circuits, gates, blocks, cells, e.g., standard and/or non-standard cells, gate arrays, PLDs, ASICs, FPGAs, PALs, GALs Implementation via software preferably involves the employment of one or more software modules. Such software modules may be programmed, for example, using languages such as Java, Objective C, C, C#, C++, Perl, Python, and/or Comega. The modules preferably communicate via SOAP, JMS, RMI, RPC, sockets, and/or pipes.

Hardware and Software

As disclosed above, the operations of the present invention are optionally executed by and/or implemented with the help of a computer. Examples of such a computer include, but are not limit to, a personal computer, an engineering workstation, a Personal Computer (PC), an Apple operating system based computer, a Personal Digital Assistant (PDA), a tablet computer, a server, and a portable computer. Examples of an operating system run by such a computer include OS X, Linux, Android, and Windows.

Figure 9:
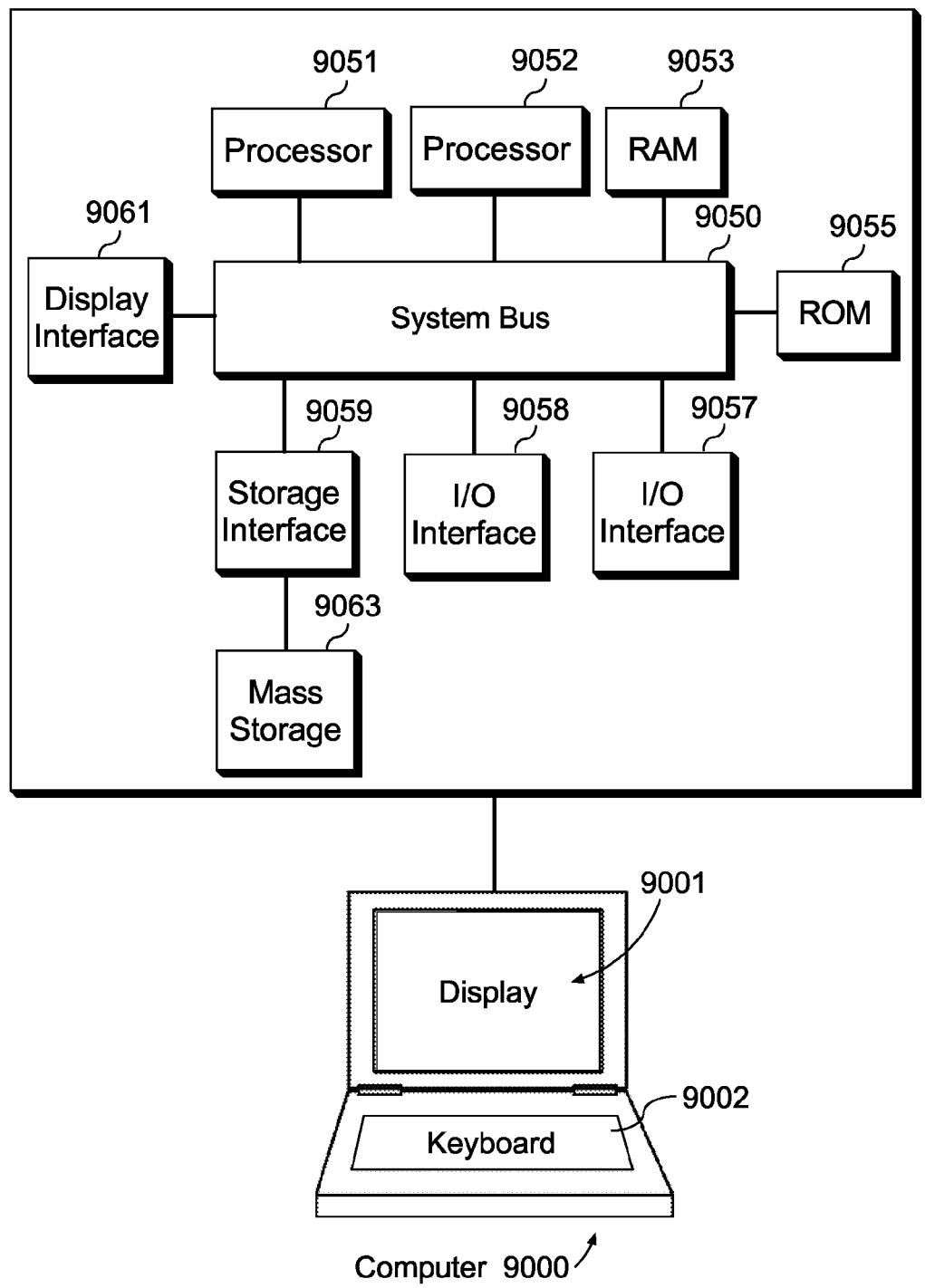
FIG. 9 illustrates a computer employable in pile-up handling operations, the delay value selection operations, and the evaluation operations according to an embodiment as described in the specification.

As another example, such a computer may comprise one or more processors operatively connected to one or more memories or storage units, in which the memories or storage units contain data, algorithms, and/or program code, and the processor or processors execute the program code and/or manipulate the program code, data, and/or algorithms. FIG. 9 illustrates a computer employable in the pile-up handling operations, the delay value selection operations, and the evaluation operations. Exemplary computer (9000) includes system bus (9050) which operatively connects two processors (9051) and (9052), random access memory (9053), read-only memory (9055), Input/Output (I/O) interfaces (9057) and (9058), storage interface (9059), and display interface (9061). Storage interface (9059) connects to mass storage (9063). Each of I/O interfaces (9057) and (9058) is, for example, an Ethernet, Universal Serial Bus (USB), an interface compliant with IEEE 1394, IEEE 1394b, IEEE 802.11a, IEEE 802.11b, IEEE 802.11g, IEEE 802.11n, Bluetooth (e.g., IEEE 802.15.1), General Packet Radio Service (GPRS), Universal Mobile Telecommunications Service (UMTS), Code Division Multiple Access 2000 (CDMA2000), Infrared Data Association (IrDA), or other applicable interface.

Mass storage (9063) is, for example, a hard drive, optical drive, flash memory, or a memory chip. An example of a processor may be, for instance, an Advanced Micro Devices (AMD) Athlon, an AMD Opteron, an AMD Phenom, an ARM processor, an Intel Xenon, an Intel Itanium, an Intel Pentium, an Intel Core, Intel dual or Intel quad processor. Computer (9000) as illustrated in this example also includes a display (9001), which may include a touch screen, and a keyboard (9002). A mouse, keypad, and/or interface can alternately or additionally be employed. Computer (9000) may include or be attached to a card reader, a DVD drive, a floppy disk drive, and/or a hard drive, whereby media containing program code for performing the above-noted operations is insertable for the purpose of loading the code onto the computer (9000).

As referred to above, a computer can run one or more software modules designed to perform the operations of the present invention. Such modules may be programmed, for example, using languages such as Java, Objective C, C, C#, C++, Perl, Python, and/or Comega according to methods known in the art. Corresponding program code can be placed on media such as DVD, CD-ROM, memory card, a flash memory, and/or floppy disk, or any other computer usable media. As noted above, the modules preferably communicate with each other via SOAP, JMS, RMI, RPC, sockets, and/or pipes.

As discussed above, operations may be implemented in hardware. Such hardware implementation may include the employment of one or more integrated circuits, specialized hardware, one or more general purpose processors, one or more chips or chipsets, and/or one or more ASICs.

It is noted that described divisions of operation are for purposes of illustration, and that alternate divisions of operation may be employed. Accordingly, for instance, operations discussed as being performed by one constituent may instead be performed by a plurality of constituents. Similarly, for instance, operations discussed as being performed by a plurality of constituents may instead be performed by a single constituent.

Ramifications and Scope

Although the description above contains many specifics, these are merely provided to illustrate the present invention and should not be construed as limitations of the invention's scope. Thus it will be apparent to those skilled in the art that various modifications and variations can be made in the embodiments of the present invention without departing from the spirit or scope of the invention.

In addition, the embodiments, features, methods, systems, and details of the invention that are described above in the application may be combined separately or in any combination to create or describe new embodiments of the invention.

What is claimed is:

1. An apparatus for pulse pile-up rejection, comprising:
   a discriminator circuit, outputting a pulse threshold-crossing time signal in response to a signal of a received single pulse if the signal of the single pulse exceeds a threshold;
   a time delay circuit coupled with the discriminator circuit, the time delay circuit receiving the pulse threshold-crossing time signal, and outputting an adjustable delayed time signal according to a delay value and the pulse threshold-crossing time signal received from the discriminator circuit for the purpose of determining pulse pile-up;
   a peak detector circuit, the peak detector circuit receiving the signal of the single pulse, determining the peak-occurrence time of the single pulse, and outputting a pulse peak-occurrence time signal indicative of the peak-occurrence time of the single pulse; and
   a comparator circuit coupled with the time delay circuit and the peak detector circuit, the comparator circuit receiving the adjustable delayed time signal from the time delay circuit and the pulse peak-occurrence time signal from the peak detector circuit, comparing the pulse peak-occurrence time signal with the adjustable delayed time signal to determine whether pulse pile-up occurs, indicating pulse acceptance if the pulse peak-occurrence time signal occurs before the adjustable delayed time signal, and outputting a pulse pile-up rejection signal indicating pulse pile-up occurrence if the pulse peak-occurrence time signal occurs after the adjustable delayed time signal.

2. The apparatus of claim 1, wherein the delay value is calculated from a time jitter of the pulse threshold-crossing time signal, a time walk of the pulse threshold-crossing time signal, a time jitter of the pulse peak-occurrence time signal, a time walk of the pulse peak-occurrence time signal, or a combination thereof.

3. The apparatus of claim 1, wherein the delay value is adjusted so that the difference between the pulse peak-occurrence time signal of the single pulse and the adjustable delayed time signal ranges from 3% to 10% of the pulse peaking time of the single pulse.

4. The apparatus of claim 1, wherein the peak detector circuit performs pulse rejection if a pulse pile-up rejection signal is received from the comparator circuit.

* * * * *